(12) United States Patent
Ramdani et al.

(10) Patent No.: US 7,485,538 B1
(45) Date of Patent: *Feb. 3, 2009

(54) HIGH PERFORMANCE SIGE HBT WITH ARSENIC ATOMIC LAYER DOPING

(75) Inventors: Jamal Ramdani, Scarborough, ME (US); Craig Richard Printy, Buxton, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 11/390,033

(22) Filed: Mar. 27, 2006

(51) Int. Cl.
*H01L 21/33* (2006.01)

(52) U.S. Cl. .................... 438/350; 438/505; 438/766; 257/E29.044

(58) Field of Classification Search ............. 438/758, 438/766, 767, 779, 309, 312, 350, 478, 503, 438/505; 257/E29.033, E29.044, E29.124
See application file for complete search history.

(56) References Cited

U.S. PATENT DOCUMENTS

| 7,067,855 B2 * | 6/2006 | Cardone et al. | 257/190 |
| 2005/0040445 A1 * | 2/2005 | Mouli | 257/290 |

* cited by examiner

*Primary Examiner*—Brook Kebede

(57) ABSTRACT

A base structure for high performance Silicon Germanium (SiGe) based heterojunction bipolar transistors (HBTs) with arsenic atomic layer doping (ALD) is disclosed. The ALD process subjects the base substrate to nitrogen gas or hydrogen gas (in ambient temperature approximately equal to 500 degrees Celsius) and provides an additional SiGe spacer layer. The surface of the final silicon cap layer is preferably etched to remove most of the arsenic. The resulting SiGe HBT with an arsenic ALD layer is less sensitive to process temperature and exposure times, and exhibits lower dopant segregation and sharper base profiles.

21 Claims, 2 Drawing Sheets

HIGH PERFORMANCE SIGE HBT WITH ARSENIC ATOMIC LAYER DOPING

CROSS-REFERENCE TO RELATED APPLICATION AND CLAIM OF PRIORITY

The present application is related to co-pending U.S. patent application Ser. No. 11/367,030 filed Mar. 2, 2006, entitled "HIGH PERFORMANCE SiGe:C HBT WITH PHOSPHOROUS ATOMIC LAYER DOPING." U.S. patent application Ser. No. 11/367,030 is assigned to the assignee of the present application and is hereby incorporated by reference into the present disclosure as if fully set forth herein. The present application claims priority under 35 U.S.C. §120 to U.S. patent application Ser. No. 11/367,030.

TECHNICAL FIELD OF THE INVENTION

The present invention is directed, in general, to atomic layer doping (ALD), and more specifically, to a high performance Silicon Germanium (SiGe) based heterojunction bipolar transistors (HBTs) with arsenic ALD.

BACKGROUND OF THE INVENTION

ALD is a method in which deposition of an atomic layer of material is controlled by a pre-deposited layer of a precursor. ALD processes typically promote the adsorption of gases into a substrate and hence the deposition of an atomic layer of material on the substrate. By alternating the supply of a reaction gas and a purging gas, ALD processes can uniquely control the deposition of material on a substrate at an atomic level. For example, when a reaction gas (or precursor) is exposed to a substrate surface, atoms of the reaction gas are chemically adsorbed into the substrate. The reaction gas is then purged by exposing the substrate to a purging gas. The purging gas ideally only reacts with the substrate where the reaction gas had been previously adsorbed. The resulting chemical reaction eventually forms an atomic layer of material onto the substrate surface. ALD thus provides unique control of the doping dosage and doping location at an atomic level, allowing for selective layer growth and both single and double layer dopant coverage.

Conventional ALD applications aid in meeting microscaled production requirements. ALD applications are typically ideal for abrupt, localized highly doped structures with relatively sharp profiles and provide little or no interaction with the growing layer. Conventional ALD doping, in a hydrogen gas ambient, generally provides high segregation of the dopant (in most cases phosphorus) and a broad profile. Thus, conventional ALD processes limit (direct current) DC and (radio frequency) RF performance. Important band engineering factors such as the gain, Early voltage, voltage between the base and collector and cutoff frequency are adversely affected.

Conventional silicon-based bipolar junction transistors (BJTs) have been a dominant semiconductor device since the advent of the integrated circuit. Many other semiconductor materials outperform silicon-based devices. However, because most semiconductors are incompatible with the silicon-based process technologies, the development of such materials has not been forthcoming. Silicon Germanium (SiGe) and Silicon Germanium: Carbon (SiGe:C) have been recent exceptions.

SiGe has an energy gap that varies as a function of the concentration of Germanium. Thus, SiGe allows for band-gap engineering, which in turn provides improvements in high speed and high frequency performance. A principal application of SiGe has been with heterojunction bipolar transistors (HBTs). The base of an HBT is the most heavily doped region of the transistor and is thus a prime area for band-gap engineering. SiGe HBTs generally offer a higher unity gain frequency, lower noise, higher collector currents and better linearity than the conventional silicon BJT. Moreover, SiGe HBTs may be integrated with existing CMOS technologies, keeping production costs for low powered, high performance products relatively low.

In conventional doping applications, the dopant, phosphorus (P), exhibits high levels of segregation as Germanium (Ge) concentrations are varied. The overall dopant profile resulting from conventional doping methods is not very sharp, but in fact relatively broad. The steepness or sharpness of the resulting curve due to phosphorus segregation is typically about 20 nanometers per decade (20 nm/dec). High P segregation adversely affects important transistor characteristics such as the gain, Early voltage, voltage between the base and collector, and cutoff frequency. Accordingly, SiGe transistors made in accordance with conventional doping methods exhibit relatively poor RF and DC performance. Moreover, other dopants, such as arsenic, exhibit high migration properties, especially in patterned wafers or oxide windows. Thus, such single crystal base structures result in extremely low doping.

There is, therefore, a need in the art for an ALD system in which there is low segregation of a dopant and less sensitivity to temperature and exposure time. There is also a need for an improved system for producing high performance SiGe based HBTs with ALD.

SUMMARY OF THE INVENTION

The present disclosure generally provides a process and base structure for high performance Silicon Germanium (SiGe) based heterojunction bipolar transistors (HBT) with arsenic atomic layer doping (ALD).

In an embodiment of the disclosure, an atomic layer doping method is provided. The method comprises flowing a first gas adjacent to a substrate; purging the substrate with arsenic; reacting a surface of the substrate to form an atomic layer of a compound; and flowing a second gas adjacent to the substrate. The compound may be an arsenic ALD layer. The concentration of arsenic may be about $3.5*10^{13}$ atoms per square centimeter. The first gas may be one of: hydrogen and nitrogen, while the second gas may be hydrogen. The atomic layer doping method is preferably performed in an ambient of about 500 degrees Celsius. The method may further comprise growing a first SiGe layer prior to flowing the first gas adjacent to the substrate. The method may further include growing a SiGe spacer layer and a silicon cap layer. The method may still further include etching the silicon cap layer to reduce the presence of arsenic.

In another embodiment of the disclosure, a transistor base structure is provided. The transistor base structure comprises a SiGe layer; an ALD layer adjacent to the SiGe layer, wherein the ALD layer is doped with arsenic; and a SiGe spacer adjacent to the ALD layer, wherein the SiGe spacer layer is grown in a gas ambient. The gas ambient may be one of: hydrogen gas and nitrogen gas. The transistor base structure may include an ALD layer doped with arsenic. The concentration of arsenic may be $3.5*10^{13}$ atoms per square centimeter. The transistor base structure may also include a silicon buffer layer adjacent to the SiGe layer and a silicon cap layer adjacent to the SiGe spacer. The surface of the silicon cap layer may be etched to remove at least some of the arsenic. The transistor may be a SiGe HBT. A secondary ion mass spectrometry (SIMS) profile of arsenic concentration as a function of depth for the transistor base structure is preferably about 6 nanometers per decade.

In still another embodiment of the disclosure, a method for building a SiGe HBT base structure is provided. The method comprises growing a silicon cap layer adjacent to a silicon buffer; and purging the Ge into the silicon cap layer to form a SiGe layer. The method also includes exposing the SiGe layer to a gas ambient at about 500 degrees Celsius; purging the SiGe:C layer with arsenic; and growing an ALD arsenic layer adjacent to the SiGe layer at about 500 degrees Celsius. The method further includes growing a SiGe spacer layer in an $N_2$ ambient, wherein the SiGe spacer layer is adjacent to the ALD dopant layer; flowing a gas adjacent to the SiGe spacer layer; and growing a silicon cap layer adjacent to the SiGe spacer. The gas ambient may be one of: hydrogen and nitrogen. The concentration of arsenic may be $3.5*10^{13}$ atoms per square centimeter.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. It is also noted that the term "layer" may mean a single layer, a portion of a layer, a layer within a layer, a sub-layer and/or multiple layers. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
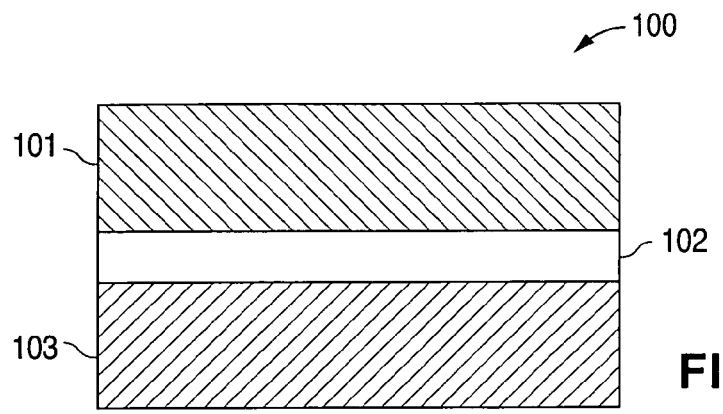
FIG. 1 depicts a simplified cross section of a base structure 100 of a Silicon Germanium (SiGe) based heterojunction bipolar transistor (HBT) in accordance with an embodiment of the present disclosure.

FIG. 1 depicts a simplified cross section of a high performance Silicon Germanium (SiGe) based heterojunction bipolar transistor (HBT) base structure 100. Two layers of SiGe 101 and 103 sandwich a dopant layer 102. Unlike conventional methods which typically use phosphorus (P) as the dopant, the base region of an exemplary SiGe HBT in accordance with an exemplary embodiment of the present disclosure uses arsenic (As) as the dopant to form dopant layer 102.

Figure 2:
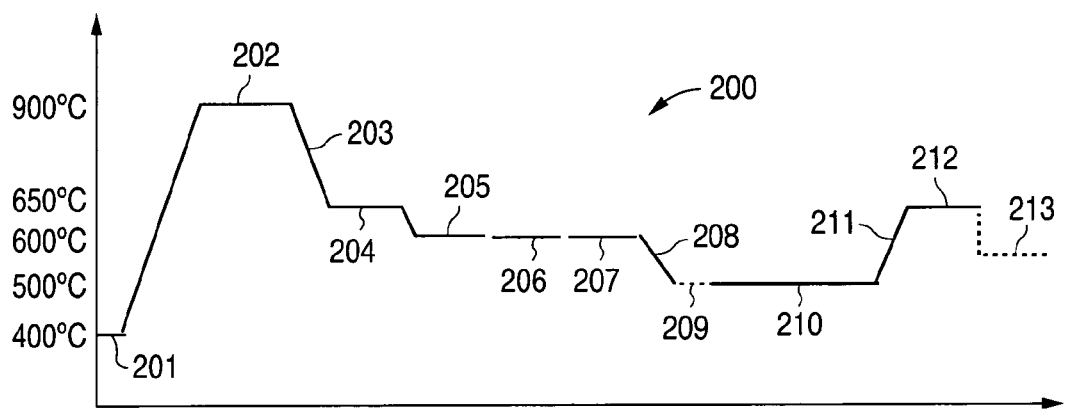
FIG. 2 depicts an exemplary process diagram for atomic layer doping (ALD) in accordance with an embodiment of the present disclosure.

FIG. 2 depicts an exemplary process diagram 200 for atomic layer doping (ALD) in accordance with an embodiment of the present disclosure. Process 200 begins at step 201 with a silicon surface layer 301a (see FIG. 3) in an ambient temperature of approximately 400 degrees Celsius (400° C.). Silicon surface layer 301a is baked at about 900° C.) in step 202 to remove any residual contaminant from the surface. Then, in step 203, silicon surface layer 301a is cooled to appropriately 600-650° C. At an ambient temperature of approximately 600° C., a silicon buffer layer 301b is grown on top of the silicon surface layer 301a in step 204. The thickness of silicon buffer layer 301b is grown to about 2-10 nm. Preferably, silicon buffer layer 310b is grown to about 5 nm.

The concentration of Ge is preferably controlled to remain substantially the same during steps 205 through 210. Process 200 continues in steps 205 and 206, where the ambient temperature is kept at approximately 600° C. and two epitaxial layers of germanium (Ge) are purged into the silicon cap layer grown in step 204. Steps 205 and 206 control Ge grading from essentially zero to about 20%. Preferably, Ge grading is sustained at about 15% Ge. After purging the silicon cap layer grown in step 204 with Ge, a SiGe layer 302 (see FIG. 3) is formed in step 207. The thickness of SiGe layer 302 is generally kept between 30-100 nm. Preferably, SiGe layer 302 is about 50 nm thick. SiGe layer 302 is then exposed to a hydrogen ($H_2$) ambient and cooled to approximately 500° C. in step 208. Alternatively, in step 208, SiGe layer 302 may be exposed to a nitrogen ($N_2$) ambient.

Process 200 continues by maintaining the deposition temperature at about 500° C. in steps 209 and 210. This is a reduction in temperature over conventional ALD doping processes. At 500° C., doping segregation effects are minimized while maintaining a high epitaxial growth rate and complying with any other manufacturing requirements. In step 209, the epitaxial growth process is temporarily interrupted and the surface of the SiGe layer 302 is exposed to dopant, preferably As, for about one minute. The result is arsenic ALD layer 303 (see FIG. 3). The concentration of dopant, As, is maintained between about $1 \times 10^{13}$ Atoms/cm$^2$ and $1 \times 10^{14}$ Atoms/cm$^2$. Preferably, the concentration of dopant, As, is about $3.5 \times 10^{13}$ Atoms/cm$^2$.

After exposure to arsenic in step 209, SiGe spacer 304 (see FIG. 3) is allowed to grow in an N$_2$ ambient for a predetermined amount of time in step 210. Step 210 may occur in an H$_2$ ambient, but an N$_2$ ambient is preferred to reduce segregation. SiGe spacer 304 is grown to a thickness between about 2-20 nm. Preferably, SiGe spacer 304 is grown to about 10 nm. In step 210, the top surface of the SiGe spacer 404, is preferably exposed to an N$_2$ ambient to aid eventually reducing vapor pressure (VP) auto-doping due to any hydrogen carry-over or memory effect later in process 300. Alternatively, in step 210, the top surface of the SiGe spacer 404 may be exposed to an H$_2$ ambient. In step 211, the SiGe spacer 304 is exposed to a hydrogen ambient (H$_2$). At this stage, process 200 preferably exposes the SiGe spacer 304 to an H$_2$ ambient rather than an N$_2$ ambient. At higher temperatures, an N$_2$ ambient would adversely react with silicon, while an H$_2$ ambient facilitates building a silicon cap faster than the same in an N$_2$ ambient.

Figure 3:
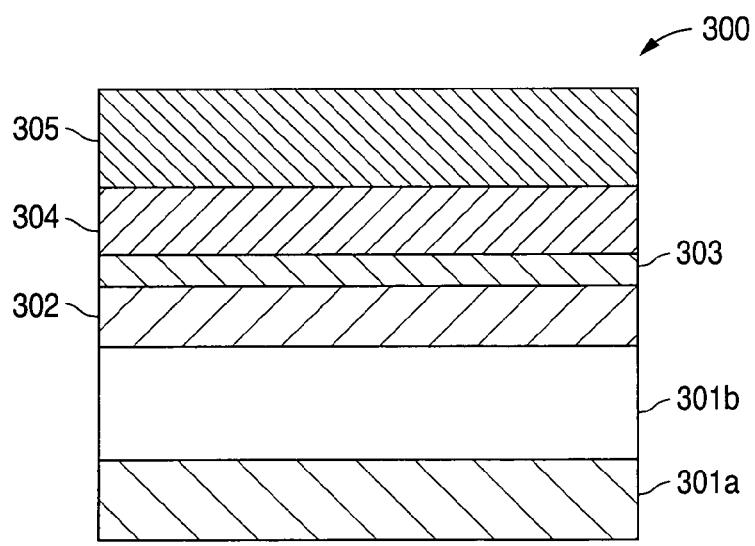
FIG. 3 depicts a simplified cross section of a base structure of an embodiment of the present disclosure.

Process 200 continues in step 212 by increasing the ambient temperature to about 650° C. and growing a final silicon cap layer 305 (see FIG. 3). Silicon cap layer 305 is grown to a thickness between about 20 nm and 60 nm. Preferably, silicon cap layer 305 is about 40 nm thick. Finally, step 212 ends with optional hydrochloric acid etching. In other words, silicon cap layer 305 is preferably exposed to an in-situ etch deposition that reduces arsenic surface contamination or surface poisoning. The etching in step 212 may alternatively occur after the epitaxial process or ex-situ. After cooling the temperature to about 600° C. in step 213, the resulting base structure 300 (see FIG. 3) may be removed. Thus, a SiGe HBT base structure 300 is formed with an arsenic ALD layer 303. Notably, in SiGe, arsenic exhibits a much lower diffusion coefficient than the same in phosphorus. In addition, arsenic does not require the addition of carbon to the SiGe film to control any transient enhanced diffusion. Thus, base structure 300 does not require any Silicon Germanium Carbon (SiGe:C) layers.

In summary, process 200 results in the exemplary base structure 300 illustrated in FIG. 3. Silicon surface layer 301a is topped with silicon buffer layer 301b. SiGe layer 302 is grown on top of silicon buffer layer 310b. An arsenic ALD layer 303 is grown on top of the SiGe layer 302. The SiGe layer 302 is topped with a SiGe spacer 304. The resulting base structure 300 is finished off with a silicon cap layer 305.

Figure 4:
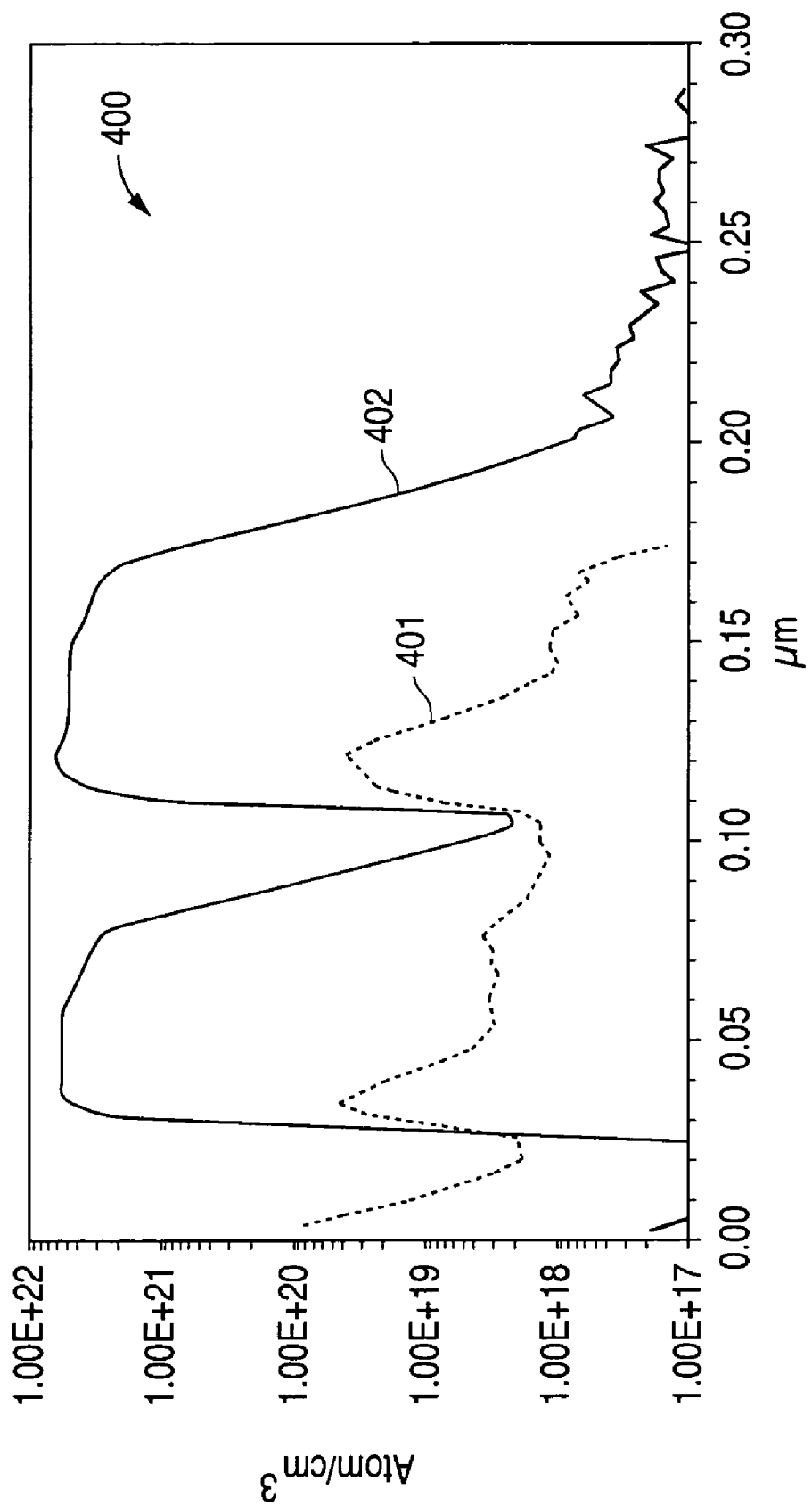
FIG. 4 depicts an example of a secondary ion mass spectrometry (SIMS) profile of the dopant concentration (atoms/$cm^3$) as a function of depth (μm) when exemplary doping methods in accordance with an embodiment of the present disclosure are used.

FIG. 4 depicts an example of a secondary ion mass spectrometry (SIMS) profile 400 illustrating dopant concentration (Atom/cm$^3$) as a function of depth (μm) when exemplary doping methods in accordance an embodiment of the present disclosure are used. The concentration of dopant, As, is shown by plot 401 in FIG. 4. On the other hand, the concentration of Ge is shown by plot 402. The steepness of the profile is optimized to about 6 nm/dec and full width at half maximum in less than 10 nm at 500° C. Preferably, the steepness of the profile should be minimized.

Accordingly, a robust process with sharp base profiles conducive for use in, for example, complimentary high speed BiCMOS where ALD techniques are is disclosed. Such techniques yield less sensitivity to process temperatures and make it possible to reduce exposure times while minimizing out-diffusion.

It is important to note that while the present invention has been described in the context of a fully functional process, those skilled in the art will appreciate that at least portions of the process are capable of adapting to a variations within the process without deviating from the preferred embodiments described above. Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An atomic layer doping (ALD) method, comprising:
flowing a first gas adjacent to a substrate;
purging the substrate with arsenic;
reacting a surface of the substrate to form an atomic layer of a compound; and
flowing a second gas adjacent to the substrate.

2. The ALD method according to claim 1, wherein the first gas is one of: hydrogen and nitrogen.

3. The ALD method according to claim 1, wherein the concentration of arsenic is about $3.5*10^{13}$ atoms per square centimeter.

4. The ALD method according to claim 1, wherein the second gas is one of: hydrogen and nitrogen.

5. The ALD method according to claim 1, wherein the method is performed in an ambient of about 500 degrees Celsius.

6. The ALD method according to claim 1 further comprising growing a first Silicon Germanium (SiGe) layer prior to the step of flowing the first gas adjacent to the substrate.

7. The ALD method according to claim 1 further comprises growing a Silicon Germanium (SiGe) spacer layer.

8. The ALD method according to claim 1, wherein the compound is an arsenic ALD layer.

9. The ALD method according to claim 1 further comprises growing a silicon cap layer.

10. The ALD method according to claim 9 further comprises etching the silicon cap layer to reduce the presence of arsenic.

11. A transistor base structure, comprising:
a Silicon Germanium (SiGe) layer;
an atomic layer doping (ALD) layer adjacent to the SiGe layer, wherein the ALD layer is doped with arsenic; and
a SiGe spacer adjacent to the ALD layer, wherein the SiGe spacer layer is grown in a gas ambient.

12. The transistor base structure according to claim 11, wherein the gas ambient is one of: hydrogen gas and nitrogen gas.

13. The transistor base structure according to claim 11, wherein the concentration of arsenic is $3.5*10^{13}$ atoms per square centimeter.

14. The transistor base structure according to claim 11 further comprising a silicon buffer layer adjacent to the SiGe layer.

15. The transistor base structure according to claim 11 further comprising a silicon cap layer adjacent to the SiGe spacer.

16. The transistor base structure according to claim 15, wherein a surface of the silicon cap layer is etched to remove at least some of the arsenic.

17. The transistor base structure according to claim 11, wherein the transistor is a Silicon Germanium (SiGe) heterojunction bipolar transistor (HBT).

18. The transistor base structure according to claim 11, wherein a secondary ion mass spectrometry (SIMS) profile of dopant concentration as a function of depth for the transistor base structure is about 6 nanometers per decade.

19. A method for building a Silicon Germanium (SiGe) heterojunction bipolar transistor (HBT) base structure, comprising:

growing a silicon cap layer adjacent to a silicon buffer;
purging Germanium (Ge) into the silicon cap layer to form a SiGe layer;
exposing the SiGe layer to a gas ambient at about 500 degrees Celsius;
purging the SiGe layer with arsenic;
growing an atomic layer doping (ALD) arsenic layer adjacent to the SiGe layer at about 500 degrees Celsius;
growing a SiGe spacer layer in a gas ambient, wherein the SiGe spacer layer is adjacent to the ALD dopant layer;
flowing hydrogen gas adjacent to the SiGe spacer layer;
growing a silicon cap layer adjacent to the SiGe spacer; and
etching the silicon cap layer to remove at least some of the arsenic.

20. A method for building a SiGe HBT base structure according to claim 19, wherein the gas ambient is one of: hydrogen and nitrogen.

21. A method for building a SiGe HBT base structure according to claim 19, wherein the concentration of arsenic is $3.5*10^{13}$ atoms per square centimeter.

* * * * *